(12) United States Patent
Ungar et al.

(10) Patent No.: US 9,455,702 B2
(45) Date of Patent: Sep. 27, 2016

(54) RESONANT-RECOVERY POWER REDUCTION TECHNIQUES FOR PULSE GENERATION

(71) Applicant: Apple Inc., Cupertino, CA (US)

(72) Inventors: P. Jeffrey Ungar, San Jose, CA (US);
William C. Athas, San Jose, CA (US);
Jeffrey G. Koller, Oxnard, CA (US);
Derek G. Pyne, Kingston (CA)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/547,705

(22) Filed: Nov. 19, 2014

(65) Prior Publication Data

US 2015/0137860 A1 May 21, 2015

Related U.S. Application Data

(60) Provisional application No. 61/906,209, filed on Nov. 19, 2013.

(51) Int. Cl.
| | |
|---|---|
| *H03K 5/13* | (2014.01) |
| *H03K 17/687* | (2006.01) |
| *H02M 1/08* | (2006.01) |
| *H02M 1/00* | (2006.01) |
| *H02M 3/158* | (2006.01) |

(52) U.S. Cl.
CPC ............ *H03K 17/687* (2013.01); *H02M 1/08*
(2013.01); *H02M 3/158* (2013.01); *H02M 2001/0054* (2013.01); *Y02B 70/1425* (2013.01); *Y02B 70/1491* (2013.01)

(58) Field of Classification Search
USPC ................ 327/109, 111, 291, 298, 587–588; 363/98, 131–132
See application file for complete search history.

(56) References Cited

U.S. PATENT DOCUMENTS

| | | | | | |
|---|---|---|---|---|---|
| 6,031,740 | A | * | 2/2000 | Budmiger | ................. G01F 1/60 363/131 |
| 7,026,765 | B2 | * | 4/2006 | Lee | ..................... G09G 3/2965 315/169.1 |
| 7,348,940 | B2 | * | 3/2008 | Cho | ..................... G09G 3/2965 345/60 |

* cited by examiner

*Primary Examiner* — An Luu
(74) *Attorney, Agent, or Firm* — Blank Rome LLP

(57) ABSTRACT

The disclosed embodiments provide a circuit for driving a capacitive load. The circuit includes a first inductor with an input terminal and a load terminal, wherein the load terminal is coupled to the capacitive load. The circuit also includes four or more switching devices. The switching devices may hold a voltage on the load terminal at zero volts. Next, the switching devices may charge the capacitive load through the first inductor until the voltage on the load terminal reaches a first input voltage supplied by a voltage source. The switching devices may then hold the voltage on the load terminal at the first input voltage. Finally, the switching devices may discharge the capacitive load through the first inductor until the voltage on the load terminal reaches zero volts.

19 Claims, 6 Drawing Sheets

RESONANT-RECOVERY POWER REDUCTION TECHNIQUES FOR PULSE GENERATION

RELATED APPLICATION

This application claims priority under 35 U.S.C. §119 to U.S. Provisional Application No. 61/906,209, entitled "Resonant-Recovery Power Reduction Techniques for Pulse Generation," by the same inventors, filed 19 Nov. 2013, the contents of which are herein incorporated by reference in their entirety.

BACKGROUND

1. Field

The disclosed embodiments relate to resonant gate drive circuits. More specifically, the disclosed embodiments relate to resonant-recovery power reduction techniques for pulse generation.

2. Related Art

When a voltage source V is used to charge a capacitive load to a charge Q, it supplies energy U=QV, some part of which is stored in the capacitive load while the rest is dissipated. For the case of complete charging and a linear capacitance C, Q=CV, and the energy supplied is $U=CV^2$, while the energy stored is only $U_{cap}=\frac{1}{2}CV^2$. The stored energy is dissipated when the capacitance is switched to ground, so the switching loss per cycle is all of the supplied energy, giving an average power loss for switching frequency f of:

$$P_{loss}=fQV \quad (1)$$

Complete charging of a linear capacitance obtains the usual result:

$$P_{loss}=fCV^2 \quad (2)$$

As a prime example of where such losses come into play, the energy consumed switching the capacitive load presented by the gate of a power metal-oxide-semiconductor field-effect transistor (MOSFET) can limit the efficiency of switch-mode DC-DC converters. Not only does the gate drive contribute to the losses, but since it and other switching losses also grow with frequency, the losses associated with inductive or capacitive energy-storing components in a converter are constrained to be greater than they otherwise could be. For example, for a simple boost converter the losses associated with its inductor are reduced as the frequency is increased, since the ripple current decreases (provided that the switching frequency is not increased to the point that a permeable core used in the inductor exhibits a substantial phase lag in its response). Higher frequency operation also allows for further optimization of the inductor within a fixed volume constraint to trade off ohmic resistive loss and any core losses.

Although there are other switching losses in these converters that need attention, the gate drive loss is often a substantial part of the switching loss. What is needed is a method that can switch the gates without losing all the energy supplied to them.

SUMMARY

The disclosed embodiments provide a circuit for driving a capacitive load. The circuit includes a first inductor with an input terminal and a load terminal, wherein the load terminal is coupled to the capacitive load. The circuit also includes four or more switching devices. The switching devices may hold a voltage on the load terminal at zero volts. Next, the switching devices may charge the capacitive load through the first inductor until the voltage on the load terminal reaches a first input voltage supplied by a voltage source. The switching devices may then hold the voltage on the load terminal at the first input voltage. Finally, the switching devices may discharge the capacitive load through the first inductor until the voltage on the load terminal reaches zero volts.

In some embodiments, charging the capacitive load through the first inductor until the voltage on the load terminal reaches the first input voltage involves coupling the input terminal to the voltage source, and transferring charge from the voltage source through the inductor to the capacitive load.

In some embodiments, holding the voltage on the load terminal at the first input voltage involves draining current from the first inductor to the voltage source after the voltage on the load terminal reaches the first input voltage, and maintaining a zero voltage drop across the first inductor after the first inductor is drained.

In some embodiments, discharging the capacitive load through the first inductor until the voltage on the load terminal reaches zero volts involves coupling the input terminal to ground, and transferring charge from the capacitive load through the inductor to ground.

In some embodiments, holding the voltage on the load terminal at zero volts involves draining current from the first inductor to the voltage source after the voltage reaches zero volts, and maintaining a zero voltage drop across the first inductor after the first inductor is drained.

In some embodiments, charging the capacitive load through the first inductor until the voltage on the load terminal reaches the first input voltage involves using the voltage source to build current in a first direction in the first inductor, and using the built current in the first direction to charge the capacitive load to the first input voltage.

In some embodiments, discharging the capacitive load through the first inductor until the voltage on the load terminal reaches zero volts involves using the voltage source to build current in a second direction in the first inductor, and using the built current in the second direction to discharge the capacitive load to the voltage source.

In some embodiments, holding the voltage on the load terminal at the first input voltage involves maintaining a zero voltage drop across the first inductor after the capacitive load is charged to the first input voltage, and holding the voltage on the load terminal at zero volts involves maintaining the zero voltage drop across the first inductor after the capacitive load is discharged to the voltage source.

In some embodiments, the circuit also includes a control mechanism configured to operate the four or more switching devices.

In some embodiments, the control mechanism includes at least one of a timing switch controller and a comparator.

In some embodiments, each of the switching devices includes a metal-oxide-semiconductor field-effect transistor (MOSFET), a second inductor coupled to a gate of the MOSFET and a second input voltage, and a switching mechanism. The switching mechanism may hold a gate voltage of the gate at zero volts, charge the gate through the second inductor until the gate voltage reaches the second input voltage, hold the gate voltage at the second input voltage, and discharge the gate through the second inductor until the gate voltage reaches zero volts. In other words, another level of switching hierarchy may be added to drive the switching devices.

In some embodiments, the four or more switching devices include:
  (i) a first switch that couples the input terminal of the first inductor to the voltage source;
  (ii) a second switch that couples the input terminal of the first inductor to ground;
  (iii) a third switch that couples the load terminal of the first inductor to the voltage source; and
  (iv) a fourth switch that couples the load terminal of the first inductor to ground.

In some embodiments, the capacitive load includes a gate of a MOSFET.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
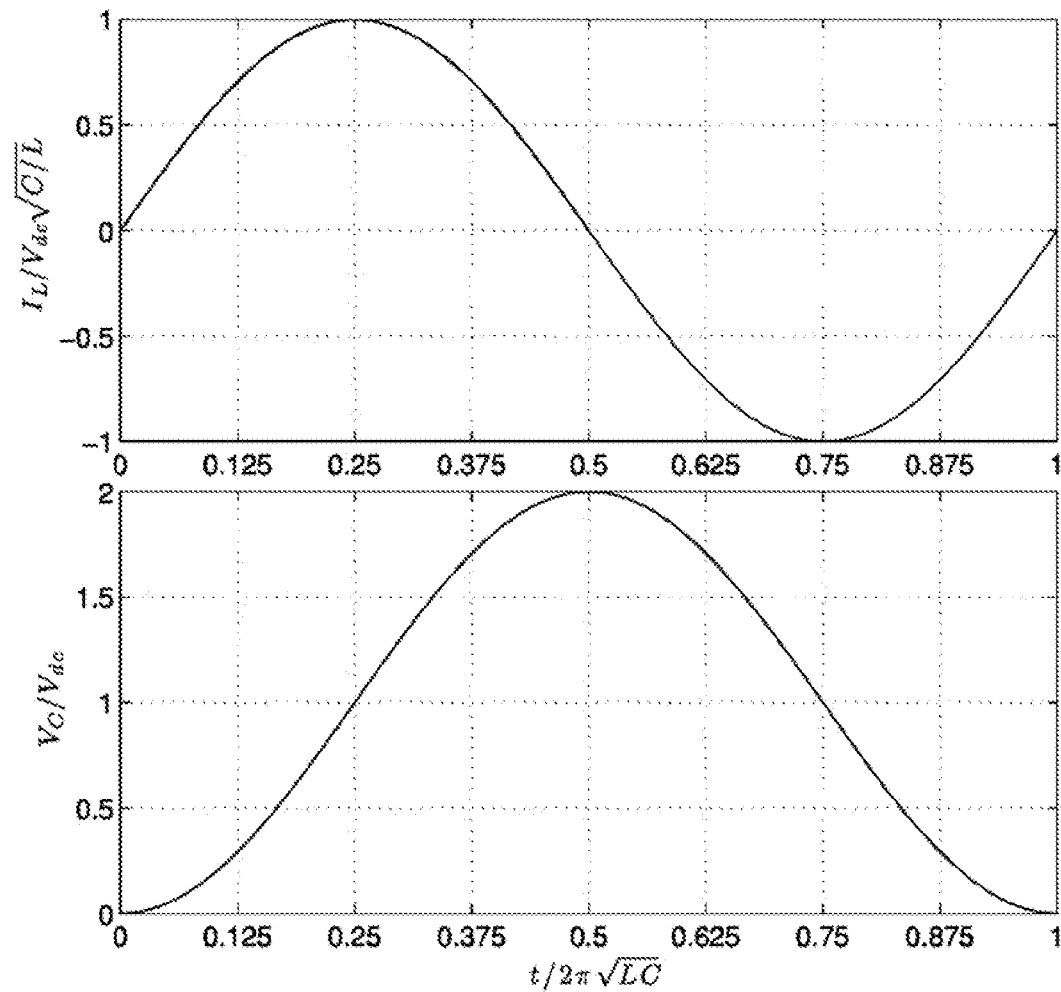
FIG. 1 shows a plot of a step response of a series LC network in accordance with the disclosed embodiments.

The disclosed embodiments provide a circuit for driving a capacitive load, such as the gate of a power metal-oxide-semiconductor field-effect transistor (MOSFET). The circuit may charge the load capacitance C from a voltage source at $V_{dc}$ through an inductor L instead of a plain wire, thereby mitigating switching loss associated with switching the gate. Most of the energy that would have been lost via conduction in the wire will be stored and resonantly exchanged among the voltage source, the inductor, and the load capacitance, as shown in FIG. 1. Outside of parasitic conduction losses that would dampen the oscillations, this system retains all its energy through a cycle. Therefore, we can bring the load capacitance to any voltage $V_C \leq 2V_{dc}$ without dissipating much energy. The task at this point is to break the charging connection to the capacitance while recovering any energy stored in the inductor.

Figure 2:
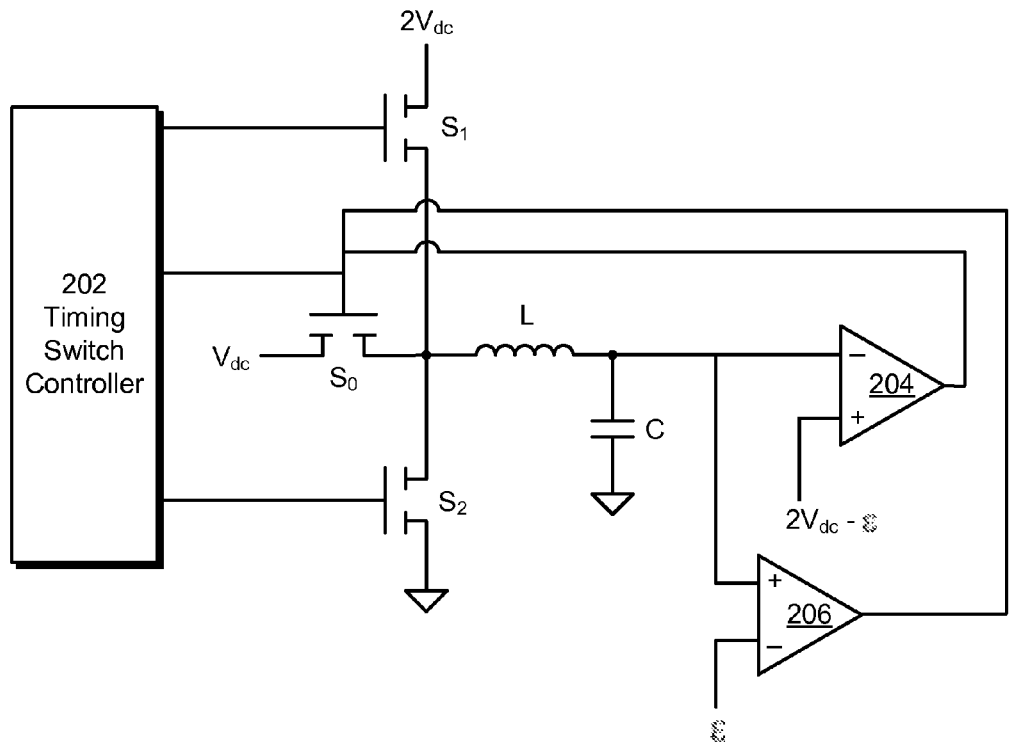
FIG. 2 shows a circuit for driving a capacitive load in accordance with the disclosed embodiments.

A favorable time to break the charging connection occurs one-half cycle into the oscillation, where $V_C = 2V_{dc}$ and $I_L = 0$, because all the resonating energy is now stored in the capacitor. In principle, it would be sufficient to disconnect the $V_{dc}$ source from the inductor at this time. In practice, a circuit such as that shown in FIG. 2 is preferred when accounting for $C_{S0}$, the parasitic capacitance across switch $S_0$ when open. The purpose of the additional switches $S_1$ and $S_2$ along with the additional voltage tap at $2V_{dc}$ is to bring the switching node, whenever $S_0$ opens, to the low or high value as appropriate and to bring the voltage across the inductor close to zero. Doing so leaves the inductor holding at zero current rather than permitting it to ring with $C_{S0}$.

The main switch $S_0$ must block current in both directions when open and can be implemented with a pair of back-to-back field-effect transistors (FETs). The holding switches $S_1$ and $S_2$ can be implemented with single FETs because $S_1$ and $S_2$ need only block current toward ground when closed.

The following table shows the switching sequence for forming a signal pulse with the circuit of FIG. 2:

| state | $S_0$ | $S_1$ | $S_2$ | $I_L$ | $V_C$ |
| --- | --- | --- | --- | --- | --- |
| hold low | 0 | 0 | 1 | 0 | 0 |
| charge | 1 | 0 | 0 | $\sin \theta_1$ | $1 - \cos \theta_1$ |
| hold high | 0 | 1 | 0 | 0 | 2 |
| discharge | 1 | 0 | 0 | $-\sin \theta_2$ | $1 + \cos \theta_2$ |

Figure 3:
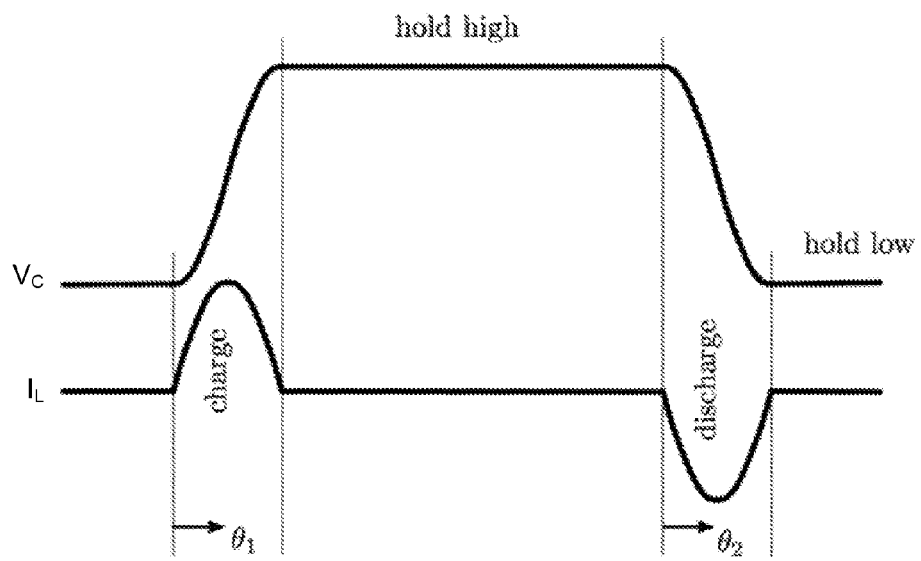
FIG. 3 shows a pulse waveform generated by a circuit in accordance with the disclosed embodiments.

FIG. 3 shows the corresponding pulse waveform created using the switching sequence. The holding states (e.g., "hold low" and "hold high") may be maintained indefinitely, while the "charge" and "discharge" transitions each occur over a resonant half cycle (the phase angles $\theta_1$ and $\theta_2$ each vary from 0 to $\pi$).

More specifically, the "hold low" state may hold the voltage at the load terminal of the inductor L, which is connected to the capacitive load C, at zero volts. During the "hold low" state, $S_2$ is closed, and $S_0$ and $S_1$ are open. Next, generation of the pulse waveform may begin with the "charge" transition, which closes $S_0$ and opens $S_1$ and $S_2$. Closing of $S_0$ may connect the input terminal of the inductor to the voltage source at $V_{dc}$ and cause the voltage at the load terminal of the inductor and, in turn, the capacitive load, to increase until the voltage reaches $2V_{dc}$. The pulse waveform may then be placed in the "hold high" state by closing $S_1$ and opening $S_0$ and $S_2$. In the "hold high" state, a zero voltage drop is maintained across the inductor by connecting the input terminal of the inductor to the voltage source at $2V_{dc}$. The "hold high" state may be maintained at the top of the voltage pulse driving the capacitive load. For example, the "hold high" state may be maintained during driving of a gate of a MOSFET corresponding to the capacitive load.

Finally, the pulse waveform may exit the "hold high" state using the "discharge" transition. During the "discharge" transition, $S_0$ is closed, and $S_1$ and $S_2$ are open. The capacitive load may thus discharge through the inductor back to the voltage source at $V_{dc}$ until the voltage on the load terminal of the inductor reaches zero volts. The charge transferred from the capacitive load may be stored at the voltage source using a filter capacitor and/or other storage mechanism. Consequently, the circuit may enable the resonant exchange of energy among the voltage source, inductor, and capacitive load. The voltage may then be held at zero volts (e.g., the "hold low" state) until the next pulse waveform is to be generated.

As shown in FIG. 2, switches $S_0$, $S_1$, and $S_2$ may be controlled by a timing switch controller 202 such as a timing generator. The timing generator may control the switches in an open loop to generate an appropriate signal pulse for driving the capacitive load C. Alternatively, the circuit and/or timing switch controller 202 may use a first comparator 204 to control $S_0$ during the "charge" transition so that $S_0$ remains closed until $V_C$ reaches $2V_{dc}-\epsilon$, with $\epsilon$ representing the latency of comparator 204. Along the same lines, the circuit and/or timing switch controller 202 may use a second comparator 206 to control $S_0$ during the "discharge" transition so that $S_0$ remains closed until $V_C$ reaches $0+\epsilon$.

Taking full control over inductor operation can provide more flexibility. The circuit shown in FIG. 4 embeds the inductor L in a full bridge of four switches $S_1$, $S_2$, $S_3$, and $S_4$ that are used to charge or discharge the capacitive load C through L, and to recover any stored energy by returning it to the voltage source at $V_{dc}$. $S_1$ may couple the input terminal of the inductor to the voltage source, $S_2$ may couple the input terminal of the inductor to ground, $S_3$ may couple the load terminal of the inductor to the voltage source, and $S_4$ may couple the load terminal of the inductor to ground.

In particular, the switches may be used to hold a voltage on the load terminal of the inductor at zero volts, and then charge the capacitive load through the first inductor until the voltage on the load terminal reaches a first input voltage supplied by a voltage source. The switches may also be used to hold the voltage on the load terminal at the first input voltage and discharge the capacitive load through the first inductor until the voltage on the load terminal reaches zero volts.

One preferred switching sequence is described in the following table:

| state | $S_1$ | $S_2$ | $S_3$ | $S_4$ | $I_L$ | $V_C$ |
|---|---|---|---|---|---|---|
| hold low | 0 | 1 | 0 | 1 | 0 | 0 |
| charge | 1 | 0 | 0 | 0 | $\sin \theta_1$ | $1 - \cos \theta_1$ |
| +inductor drain | 0 | 1 | 1 | 0 | $1 - \phi_1/\Delta\phi$ | 1 |

-continued

| state | $S_1$ | $S_2$ | $S_3$ | $S_4$ | $I_L$ | $V_C$ |
|---|---|---|---|---|---|---|
| hold high | 1 | 0 | 1 | 0 | 0 | 1 |
| discharge | 0 | 1 | 0 | 0 | $-\sin \theta_2$ | $\cos \theta_2$ |
| −inductor drain | 1 | 0 | 0 | 1 | $-1 + \phi_2/\Delta\phi$ | 0 |

Figure 5:
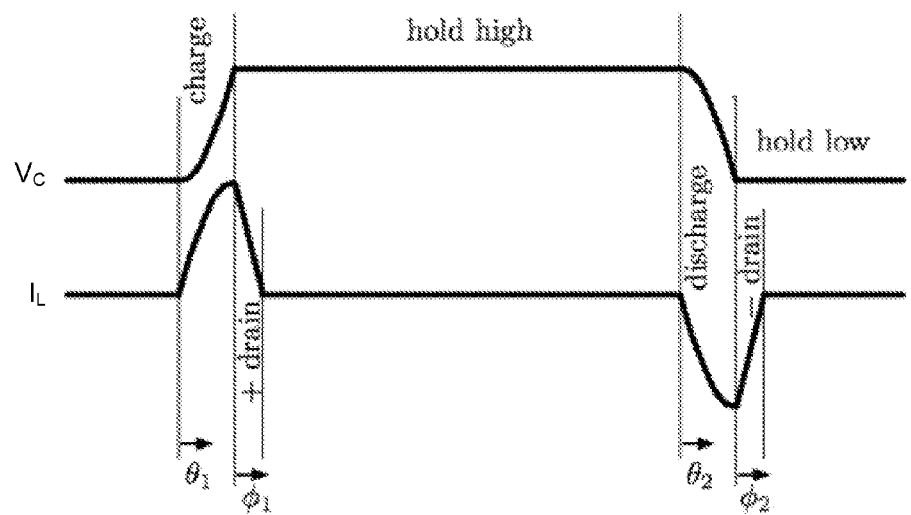
FIG. 5 shows a pulse waveform generated by a circuit in accordance with the disclosed embodiments.

The corresponding pulse waveform created using the switching sequence above is shown in FIG. 5. In the holding (e.g., "hold low" and "hold high") states, the switches are used to hold C at $V_{dc}$ or 0 with zero voltage drop across the inductor. The "charge" and "discharge" states each proceed for one-quarter cycle ($\theta_1$ and $\theta_2$ each vary from 0 to $\pi/2$). After either of these states, energy is stored in the inductor and recovered by returning it to the voltage source $V_{dc}$ over a phase interval $\Delta\phi$. These are the "± inductor drain" states.

More specifically, the switching sequence may connect both terminals of the inductor to ground during the "hold low" state by opening $S_1$ and $S_3$ and closing $S_2$ and $S_4$. As a result, a zero voltage drop is maintained across the inductor, and the load terminal of the inductor, which is connected to the capacitive load, has a voltage of zero volts.

Next, the circuit may enter the "charge" transition by closing $S_1$ and opening $S_2$ and $S_4$. The closing of $S_1$ may couple the input terminal of the inductor to the voltage source at $V_{dc}$, causing charge from the voltage source to flow through the inductor to C. However, unlike the circuit of FIG. 2, the circuit of FIG. 4 may exit the "charge" transition once the voltage reaches $V_{dc}$ instead of $2V_{dc}$. At the end of the "charge" transition, the inductor may be filled with current, which is returned to the voltage source in the "+ inductor drain" state by closing $S_2$ and $S_3$ and opening $S_1$ and $S_4$. In the "+ inductor drain" state, the load terminal of the inductor stays at $V_{dc}$, while current from the inductor is drained to the voltage source using $S_2$ and $S_3$. After the inductor is fully drained, the circuit is placed in the "hold high" state by closing $S_1$ and $S_3$ and opening $S_2$ and $S_4$. During the "hold high" state, the voltage at the load terminal is kept at $V_{dc}$, and a zero voltage drop is maintained across the inductor.

At the end of the "hold high" state, the "discharge" transition may be initiated by closing $S_2$ and opening $S_1$ and $S_3$. During the "discharge" transition, the capacitive load is discharged through the inductor by coupling the input terminal of the inductor to ground. Once the capacitive load is fully discharged, the circuit may enter the "− inductor drain" state by closing $S_1$ and $S_4$ and opening $S_2$, causing current in the inductor to return to the voltage source. Because the "± inductor drain" states allow current, and thus energy, from the inductor to be stored and subsequently used by the voltage source, the switching sequence may increase the efficiency of driving the capacitive load. In other words, energy used to drive the capacitive load may be resonantly transferred back to the voltage source by the inductor instead of dissipated. After the inductor is fully drained, the circuit may be placed in the "hold low" state until the next pulse waveform is to be generated.

We note that the sequence can be time-reversed as described by the following table:

| state | $S_1$ | $S_2$ | $S_3$ | $S_4$ | $I_L$ | $V_C$ |
|---|---|---|---|---|---|---|
| hold low | 0 | 1 | 0 | 1 | 0 | 0 |
| +inductor fill | 1 | 0 | 0 | 1 | $\phi_1/\Delta\phi$ | 0 |
| charge | 0 | 1 | 0 | 0 | $\cos \theta_1$ | $\sin \theta_1$ |

-continued

| state | $S_1$ | $S_2$ | $S_3$ | $S_4$ | $I_L$ | $V_C$ |
|---|---|---|---|---|---|---|
| hold high | 1 | 0 | 1 | 0 | 0 | 1 |
| −inductor fill | 0 | 1 | 1 | 0 | $-\phi_2/\Delta\phi$ | 1 |
| discharge | 1 | 0 | 0 | 0 | $-\cos\theta_2$ | $1-\sin\theta_2$ |

Figure 6:
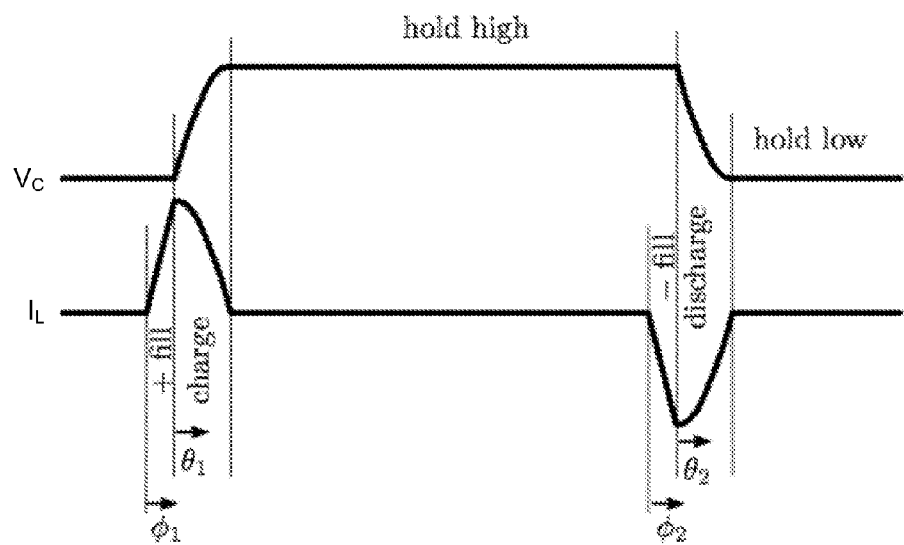
FIG. 6 shows a pulse waveform generated by a circuit in accordance with the disclosed embodiments.

The corresponding pulse waveform created using the switching sequence above is shown in FIG. 6. The idea here is to pre-charge the inductor with current, and then use the current to charge C. To discharge C, the current is built up in the inductor in the opposite direction and used to discharge C to the voltage source at $V_{dc}$.

As with the previous sequence, the "hold low" state may connect both terminals of the inductor to ground during the "hold low" state by opening $S_1$ and $S_3$ and closing $S_2$ and $S_4$. Next, the "+ inductor fill" state may be initiated by closing $S_1$ and $S_4$ and opening $S_2$ and $S_3$. As a result, current from the voltage source may build in a first (e.g., forward) direction in the inductor without passing onto the capacitive load. The circuit may then enter the "charge" transition by closing $S_2$ and opening $S_1$ and $S_4$. In the "charge" transition, current built in the inductor in the first direction may be used to charge the capacitive load to $V_{dc}$. The "hold high" state may then be used to keep the voltage at the load terminal of the inductor and, in turn, the capacitive load at $V_{dc}$. For example, the "hold high" state may be used to drive a gate of a MOSFET corresponding to the capacitive load. As with the previous sequence, the circuit may be placed in the "hold high" state by closing $S_1$ and $S_3$ and opening $S_2$ and $S_4$.

After the "hold high" state has concluded, the "− inductor fill" state may be initiated by closing $S_2$ and $S_3$ and opening $S_1$ and $S_4$. In the "− inductor fill" state, current is built in the opposite (e.g., reverse) direction in the inductor from that of the "+ inductor fill" state. The "discharge" transition may then be initiated by closing $S_1$ and opening $S_2$, $S_3$, and $S_4$. In the "discharge" transition, current built in the inductor in the opposite direction may be used to discharge the capacitive load to the voltage source until the voltage at the load terminal of the inductor reaches zero volts. The circuit may then be maintained in the "hold low" state until the next pulse waveform is to be generated.

The switches may all be implemented using single FETs since each switch only needs to block current in one direction. Furthermore, $S_3$ and $S_4$ may be diodes pointing toward $V_{dc}$ for the first sequence. As with the circuit of FIG. 2, the switches in the circuit of FIG. 4 may be controlled by a timing switch controller 402. For example, timing switch controller 402 may be a timing generator that controls the switches in an open loop to generate a signal pulse for driving the capacitive load C. On the other hand, the circuit and/or timing switch controller 402 may use a first comparator 404 to control the switches during the "charge" transition so that the capacitive load is charged until $V_C$ reaches $V_{dc}-\epsilon$, with $\epsilon$ representing the latency of comparator 404. The circuit and/or timing switch controller 402 may also use a second comparator 404 to control the switches during the "discharge" transition so that the capacitive load discharges until $V_C$ reaches $0+\epsilon$.

The 3-switch and 4-switch circuits described above can recover a substantial portion of the energy that would have been lost generating pulses on a capacitive load using a voltage source and conventional means. On the other hand, additional switches are used to accomplish the energy recovery and will in turn suffer conventional switching losses. There is still a major efficiency benefit if the losses incurred by the new switches are much smaller than the energy recovered while switching the capacitive load. This is very likely to be the case for a typical application.

For example, if the circuit is used to drive the gate of a large FET, then the FETs used to implement these circuits can be much smaller than the large FET, and so incur much smaller switching losses than the energy recovered using resonance to drive the large FET's gate. The main switch $S_0$ in the 3-switch circuit of FIG. 2 would drive charge in and out of the large FET's gate, which is presumably being used to control far larger currents in its circuit, so it can be sized accordingly. The holding switches $S_1$ and $S_2$ would be smaller still since they only deal with the parasitic capacitances of $S_0$ and each other. The four switches in the full bridge circuit of FIG. 4 would all be the same size, and would be selected to handle driving charge in and out of the large FET's gate.

The main challenge in using these resonant recovery techniques to shape pulses on a capacitive load is in achieving the proper switching times to realize pulse waveforms that are substantially similar to the ideal ones depicted in FIGS. 3, 5, and 6.

Figure 4:
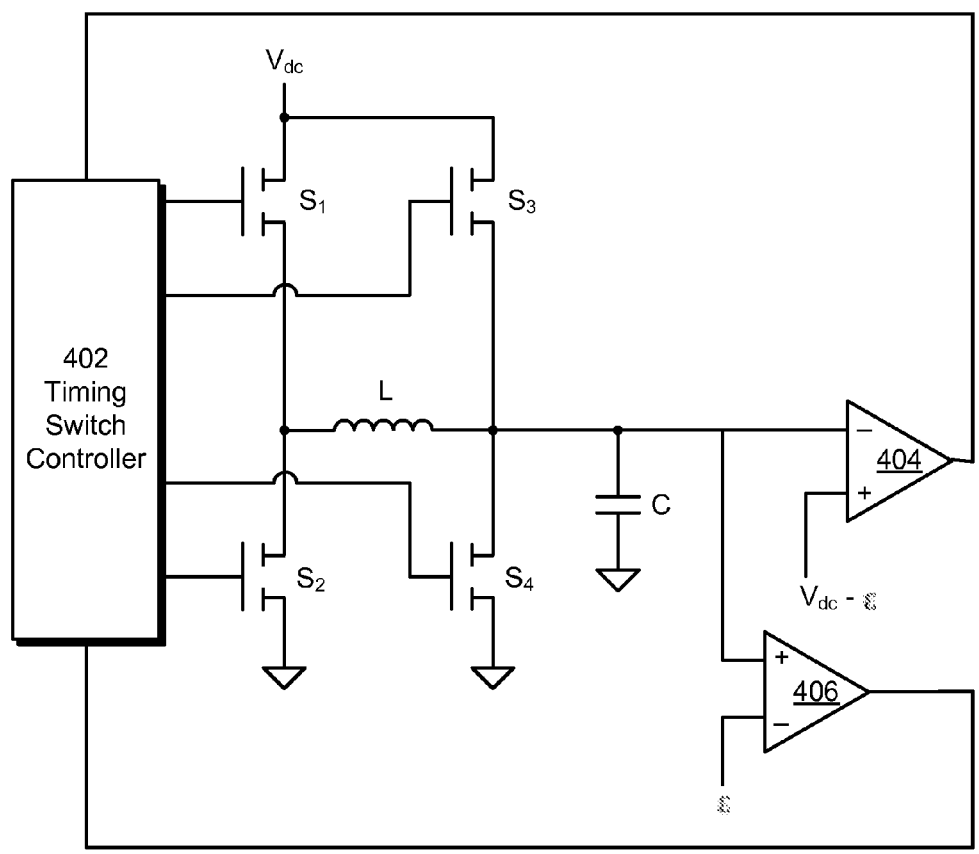
FIG. 4 shows a circuit for driving a capacitive load in accordance with the disclosed embodiments.

To further increase the efficiency of driving a capacitive load such as a FET, switches in the circuits of FIGS. 2 and 4 may be controlled using the same resonant recovery techniques and/or components. For example, the circuit of FIG. 4 may be used to drive a large FET, while each of the switches in the circuit may be a smaller FET that is driven by another circuit with a separate inductor embedded in a full bridge of four other switches. The circuit may continue to be recursively duplicated using smaller FETs until the losses incurred by the FETs are comparable to energy recovered by the FETs in switching a larger FET.

Figure 7:
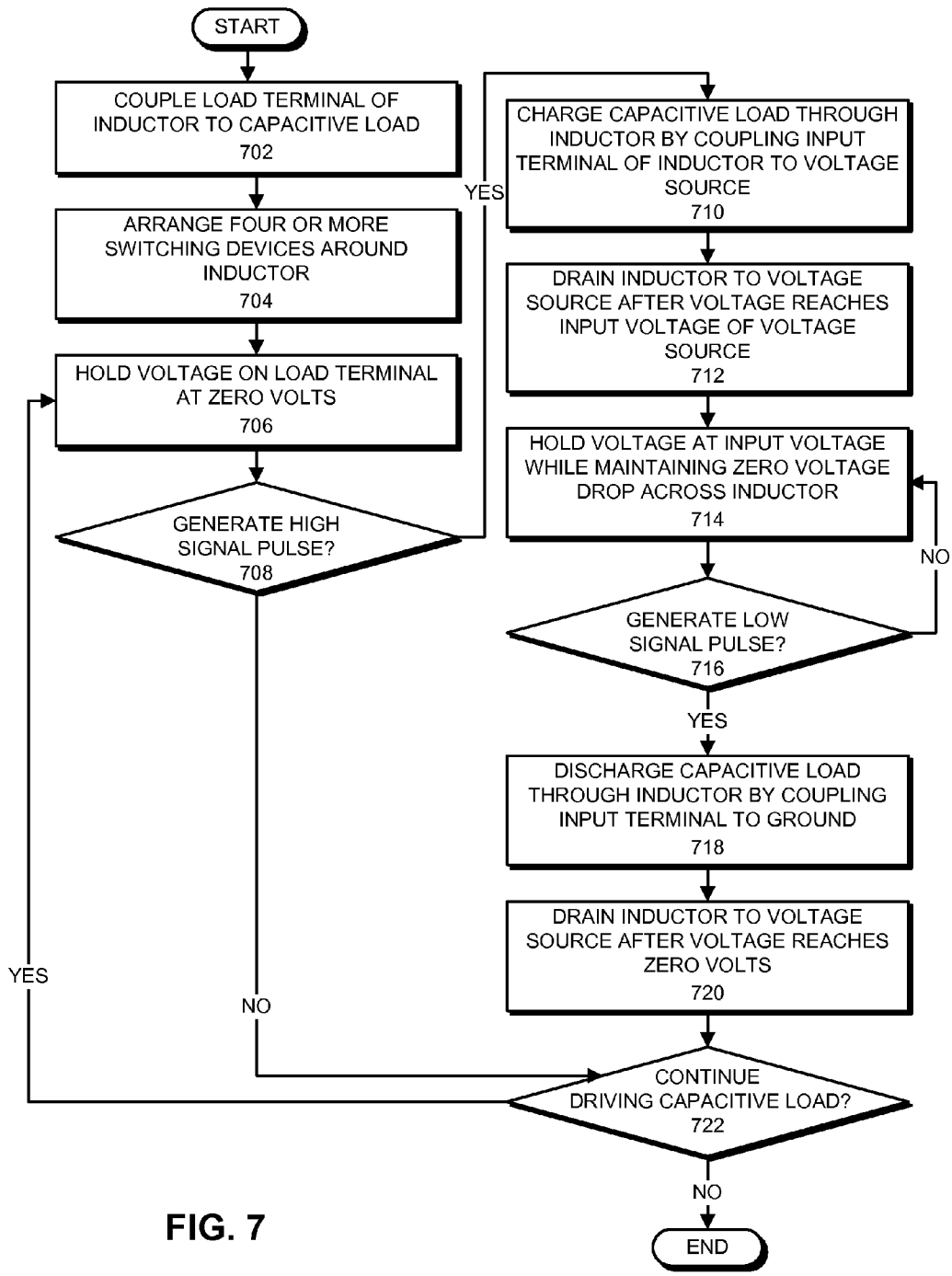
FIG. 7 shows a flowchart illustrating the process of driving a capacitive load in accordance with the disclosed embodiments.

FIG. 7 shows a flowchart illustrating the process of driving a capacitive load in accordance with the disclosed embodiments. In one or more embodiments, one or more of the steps may be omitted, repeated, and/or performed in a different order. Accordingly, the specific arrangement of steps shown in FIG. 7 should not be construed as limiting the scope of the embodiments.

Initially, a load terminal of an inductor is coupled to a capacitive load (operation 702). The capacitive load may be driven by a signal pulse. For example, the capacitive load may be the gate of a MOSFET in a power supply that is continuously switched using the signal pulse. Next, four or more switching devices are arranged around the inductor (operation 704). For example, the inductor may be embedded in a full bridge of four switching devices, including a first switch that couples the input terminal of the first inductor to a voltage source and a second switch that couples the input terminal of the first inductor to ground. The switching devices may also include a third switch that couples the load terminal of the first inductor to the voltage source and a fourth switch that couples the load terminal of the first inductor to ground.

The voltage on the load terminal is held at zero volts (operation 706) until a high signal pulse is to be generated (operation 708) using the inductor and switching devices. If the signal pulse is not to be generated, the voltage on the load terminal may continue to be held at zero volts (e.g., in between signal pulses).

If the signal pulse is to be generated, the capacitive load is charged through the inductor by coupling the input terminal of the inductor to a voltage source (operation 710), thus transferring charge from the voltage source through the inductor to the capacitive load. Next, the inductor is drained to the voltage source after the voltage on the load terminal reaches the input voltage of the voltage source (operation 712). The voltage on the load terminal is then held at the input voltage while maintaining a zero voltage drop across the inductor (operation 714), thus driving the capacitive load at the input voltage.

The voltage on the load terminal may be maintained at the input voltage until a low signal pulse is to be generated (operation 708). If the low signal pulse is to be generated, the capacitive load is discharged through the inductor by coupling the input terminal of the inductor to ground (operation 718). Such coupling of the input terminal to ground may transfer charge from the capacitive load to the inductor. Finally, the inductor is drained to the voltage source after the voltage on the load terminal reaches zero volts (operation 720). Because energy is resonantly transferred among the voltage source, inductor, and capacitive load, driving of the capacitive load may be more efficient than non-resonant techniques for driving capacitive loads.

The capacitive load may continue to be driven (operation 722) using the inductor and switching devices. For example, the gate of a MOSFET corresponding to the capacitive load may be driven using high and low signal pulses generated using the inductor and switching devices during operation of a power supply containing the MOSFET. If the capacitive load is to be driven, the voltage on the load terminal is held at zero volts (operation 706) in between signal pulses. Each high signal pulse is then generated (operation 708) by charging the capacitive load through the inductor (operation 710), draining the inductor to the voltage source after the capacitive load is charged (operation 712), and holding the voltage at the input voltage (operation 714). A low signal pulse following the high signal pulse may then be generated (operation 716) by discharging the capacitive load through the inductor (operation 718) and draining the inductor to the voltage source after the capacitive load is discharged (operation 720). Energy may thus continue to be resonantly recovered from the capacitive load until the capacitive load is no longer being driven (e.g., a power supply containing the capacitive load is no longer being used).

Figure 8:
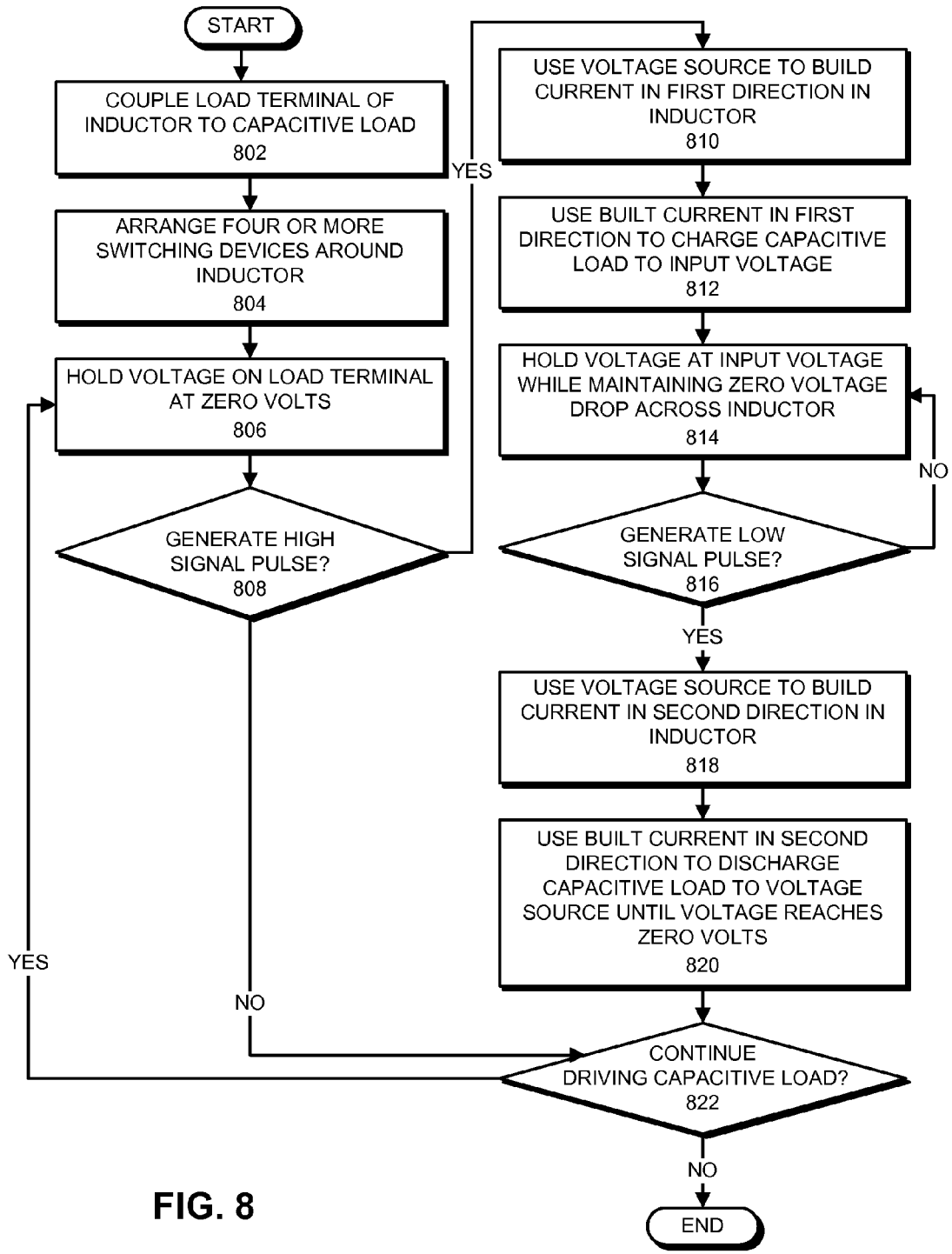
FIG. 8 shows a flowchart illustrating the process of driving a capacitive load in accordance with the disclosed embodiments.

FIG. 8 shows a flowchart illustrating the process of driving a capacitive load in accordance with the disclosed embodiments. In one or more embodiments, one or more of the steps may be omitted, repeated, and/or performed in a different order. Accordingly, the specific arrangement of steps shown in FIG. 8 should not be construed as limiting the scope of the embodiments.

First, a load terminal of an inductor is coupled to a capacitive load (operation 802) such as a gate of a MOSFET. Four or more switching devices are also arranged around the inductor (operation 804), and the voltage on the load terminal is held at zero volts (operation 806) until a signal pulse is to be generated (operation 808) using the inductor and switching devices. If the signal pulse is not to be generated, the voltage on the load terminal may continue to be held at zero volts (e.g., in between signal pulses).

If the signal pulse is to be generated, the voltage source is used to build current in a first direction in the inductor (operation 810), and the built current in the first direction is used to charge the capacitive load to the input voltage (operation 812). Charging of the capacitive load may drain the inductor, and the voltage at the load terminal of the inductor may be held at the input voltage while maintaining a zero voltage drop across the inductor (operation 814). In other words, charging and holding of the capacitive load at the input voltage may cause the capacitive load to be driven at the input voltage.

The voltage on the load terminal (e.g., the high signal pulse) may be maintained at the input voltage until a low signal pulse is to be generated (operation 708). To generate the low signal pulse, the voltage source is used to build current in a second direction in the inductor (operation 818), and the built current in the second direction is used to discharge the capacitive load to the voltage source until the voltage on the load terminal reaches zero volts (operation 820). The second direction may be opposite the first direction used in charging the capacitive load. As a result, energy used to drive the capacitive load may be returned to the voltage source instead of dissipated.

Driving of the capacitive load may continue (operation 822). If the capacitive load is to be driven, the voltage on the load terminal is held at zero volts (operation 806) in between signal pulses. Each high signal pulse is then generated by building current in the first direction in the inductor (operation 810), using the built current to charge the capacitive load to the input voltage (operation 812), and holding the voltage at the input voltage (operation 814). A low signal pulse following the high signal pulse may then be generated (operation 816) by using the voltage source to build current in the second direction in the inductor (operation 816) and using the built current to discharge the capacitive load to the voltage source (operation 818). Energy may thus continue to be resonantly recovered from the capacitive load until the capacitive load is no longer being driven (e.g., a power supply containing the capacitive load is no longer being used).

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A circuit for driving a capacitive load, comprising:
   a first inductor with an input terminal and a load terminal, wherein the load terminal is coupled to the capacitive load; and
   four or more switching devices configured to:
      hold a voltage on the load terminal at zero volts;
      charge the capacitive load through the first inductor until the voltage on the load terminal reaches a first input voltage supplied by a voltage source;
      hold the voltage on the load terminal at the first input voltage by, at least in part, draining the first inductor to the voltage source after the voltage on the load terminal reaches the first input voltage, and maintaining a zero voltage drop across the first inductor after the first inductor is drained; and
      discharge the capacitive load through the first inductor until the voltage on the load terminal reaches zero volts.

2. The circuit of claim 1, wherein discharging the capacitive load through the first inductor until the voltage on the load terminal reaches zero volts involves:
   coupling the input terminal to ground; and
   transferring charge from the capacitive load through the inductor to ground, and wherein holding the voltage on the load terminal at zero volts involves:
   draining the first inductor to the voltage source after the voltage on the load terminal reaches zero volts; and
   maintaining a zero voltage drop across the first inductor after the first inductor is drained.

3. The circuit of claim 1, wherein charging the capacitive load through the first inductor until the voltage on the load terminal reaches the first input voltage involves:
  using the voltage source to build current in a first direction in the first inductor; and
  using the built current in the first direction to charge the capacitive load to the first input voltage.

4. The circuit of claim 3, wherein discharging the capacitive load through the first inductor until the voltage on the load terminal reaches zero volts involves:
  using the voltage source to build current in a second direction in the first inductor; and
  using the built current in the second direction to discharge the capacitive load to the voltage source.

5. The circuit of claim 1, wherein holding the voltage on the load terminal at the first input voltage involves maintaining a zero voltage drop across the first inductor after the capacitive load is charged to the first input voltage, and
  wherein holding the voltage on the load terminal at zero volts involves maintaining the zero voltage drop across the first inductor after the capacitive load is discharged to the voltage source.

6. The circuit of claim 1, further comprising:
  a control mechanism configured to operate the four or more switching devices.

7. The circuit of claim 6, wherein the control mechanism comprises at least one of:
  a timing switch controller; and
  a comparator.

8. The circuit of claim 1, wherein each of the switching devices comprises:
  a metal-oxide-semiconductor field-effect transistor (MOSFET);
  a second inductor coupled to a gate of the MOSFET and a second input voltage; and
  a switching mechanism configured to:
    hold a gate voltage of the gate at zero volts;
    charge the gate through the second inductor until the gate voltage reaches the second input voltage;
    hold the gate voltage at the second input voltage; and
    discharge the gate through the second inductor until the gate voltage reaches zero volts.

9. The circuit of claim 1, wherein the four or more switching devices comprise:
  a first switch that couples the input terminal of the first inductor to the voltage source;
  a second switch that couples the input terminal of the first inductor to ground;
  a third switch that couples the load terminal of the first inductor to the voltage source; and
  a fourth switch that couples the load terminal of the first inductor to ground.

10. The circuit of claim 1, wherein the capacitive load comprises a gate of a MOSFET.

11. A method for driving a capacitive load, comprising:
  coupling a load terminal of an inductor to the capacitive load; and
  using four or more switching devices to generate a signal pulse for driving the capacitive load by:
  holding a voltage on the load terminal at zero volts;
  charging the capacitive load through the inductor by coupling an input terminal of the inductor to a voltage source;
  draining the inductor to the voltage source after the voltage reaches an input voltage of the voltage source;
  after the inductor is drained, holding the voltage at the input voltage while maintaining a zero voltage drop across the inductor;
  discharging the capacitive load through the inductor by coupling the input terminal to ground; and
  draining the inductor to the voltage source after the voltage reaches zero volts.

12. The method of claim 11, wherein the four or more switching devices comprise:
  a first switch that couples the input terminal of the inductor to the voltage source;
  a second switch that couples the input terminal of the inductor to ground;
  a third switch that couples the load terminal of the inductor to the voltage source; and
  a fourth switch that couples the load terminal of the inductor to ground.

13. The method of claim 11, wherein the capacitive load comprises a gate of a metal-oxide-semiconductor field-effect transistor (MOSFET).

14. A method for driving a capacitive load, comprising:
  coupling a load terminal of an inductor to the capacitive load; and
  using four or more switching devices to generate a signal pulse for driving the capacitive load by:
  holding a voltage on the load terminal at zero volts;
  using a voltage source to build current in a first direction in the inductor;
  using the built current in the first direction to charge the capacitive load to an input voltage;
  holding the voltage at the input voltage while maintaining a zero voltage drop across the inductor;
  using the voltage source to build current in a second direction in the inductor; and
  using the built current in the second direction to discharge the capacitive load to the voltage source until the voltage reaches zero volts.

15. The method of claim 14, wherein the four or more switching devices comprise:
  a first switch that couples an input terminal of the inductor to the voltage source;
  a second switch that couples the input terminal of the inductor to ground;
  a third switch that couples the load terminal of the inductor to the voltage source; and
  a fourth switch that couples the load terminal of the inductor to ground.

16. The method of claim 14, wherein the capacitive load comprises a gate of a metal-oxide-semiconductor field-effect transistor (MOSFET).

17. A power supply, comprising:
  a metal-oxide-semiconductor field-effect transistor (MOSFET); and
  a circuit for driving a gate of the MOSFET, comprising:
    a first inductor coupled to a first input voltage and a capacitive load; and
    four or more switching devices configured to generate a signal pulse for driving the gate by:
      holding a voltage on a load terminal at zero volts;
      charging the capacitive load through the first inductor until the voltage on the load terminal reaches a first input voltage supplied by a voltage source;
      holding the voltage on the load terminal at the first input voltage; and
      discharging the capacitive load through the first inductor until the voltage on the load terminal reaches zero volts, wherein each of the switching devices comprises:
a metal-oxide-semiconductor field-effect transistor (MOSFET);
a second inductor coupled to a gate of the MOSFET and a second input voltage; and
a switching mechanism configured to:
hold a gate voltage of the gate at zero volts;
charge the gate through the second inductor until the gate voltage reaches the second input voltage;
hold the gate voltage at the second input voltage; and
discharge the gate through the second inductor until the gate voltage reaches zero volts.

18. The power supply of claim 17, further comprising:
a control mechanism configured to operate the four or more switching devices.

19. The power supply of claim 18, wherein the control mechanism comprises at least one of:
a timing switch controller; and
a comparator.

* * * * *